United States Patent
Laursen

(10) Patent No.: US 6,258,711 B1
(45) Date of Patent: Jul. 10, 2001

(54) SACRIFICIAL DEPOSIT TO IMPROVE DAMASCENE PATTERN PLANARIZATION IN SEMICONDUCTOR WAFERS

(75) Inventor: Thomas Laursen, Tempe, AZ (US)

(73) Assignee: SpeedFam-IPEC Corporation, Chandler, AZ (US)

(*) Notice: Subject to any disclaimer, the term of this patent is extended or adjusted under 35 U.S.C. 154(b) by 0 days.

(21) Appl. No.: 09/294,406

(22) Filed: Apr. 19, 1999

(51) Int. Cl.[7] ................................. H01L 21/4763
(52) U.S. Cl. ............... 438/633; 438/645; 438/672; 438/699; 438/701; 438/759; 438/760
(58) Field of Search ...................... 438/633, 645, 438/672, 697, 699, 701, 759, 760

(56) References Cited

U.S. PATENT DOCUMENTS

| 5,597,341 | 1/1997 | Kodera et al. ................ 451/5 |
| 5,618,381 | * 4/1997 | Doan et al. ................ 438/633 |
| 5,681,423 | 10/1997 | Sandhu et al. ................ 21/302 |
| 5,752,875 | * 5/1998 | Ronay ................ 451/41 |
| 5,786,260 | 7/1998 | Jang et al. ................ 23/58 |
| 5,850,105 | 12/1998 | Dawson et al. ................ 23/58 |
| 5,854,133 | 12/1998 | Hachiya et al. ................ 21/302 |
| 5,874,318 | * 2/1999 | Baker et al. ................ 438/8 |
| 5,885,900 | * 3/1999 | Schwartz ................ 438/697 |

FOREIGN PATENT DOCUMENTS

| 859407A2 | 8/1998 | (EP) ................ 21/768 |
| 6-349798 | 12/1994 | (JP) . |

* cited by examiner

*Primary Examiner*—David Nelms
*Assistant Examiner*—Reneé R. Berry
(74) *Attorney, Agent, or Firm*—Merchant & Gould

(57) ABSTRACT

A method of reducing dishing and erosion of surfaces of inlaid material on semiconductor wafers. The method includes forming a sacrificial deposit or layer over at least down features of the patterned surface of the fill layer, that has a lower rate of removal during chemical-mechanical polishing than the fill layer. Elevated caps of sacrificial deposit are formed over inlaid fill material prior to pattern clearing. In CMP pattern clearing, the caps are removed and polishing proceeds at a faster rate on the slightly elevated inlaid fill upper surfaces until they are coplanar with surrounding patterned substrate. Chemical-mechanical polishing can be carried out in a single step, or in multiple steps, to produce the desired result.

24 Claims, 2 Drawing Sheets

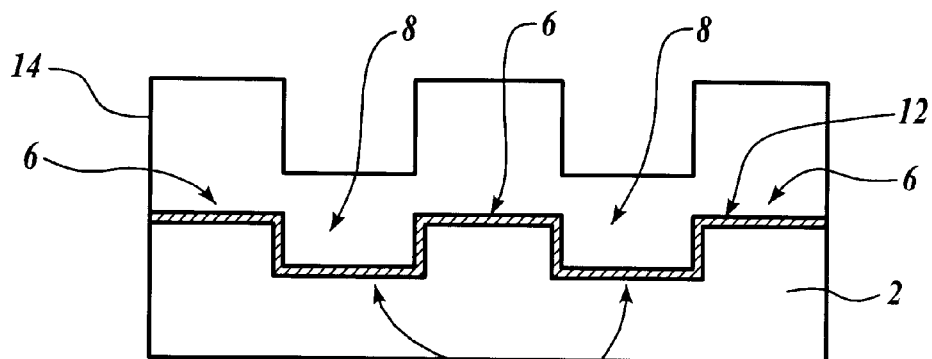
Fig. 1A *(PRIOR ART)*
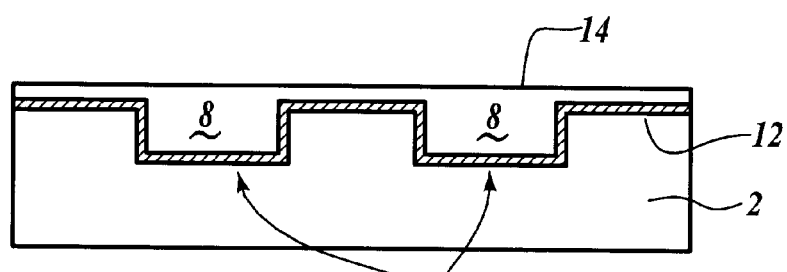
Fig. 1B *(PRIOR ART)*
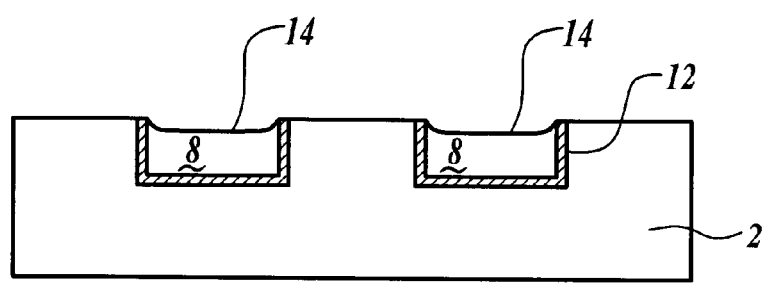
Fig. 1C *(PRIOR ART)*

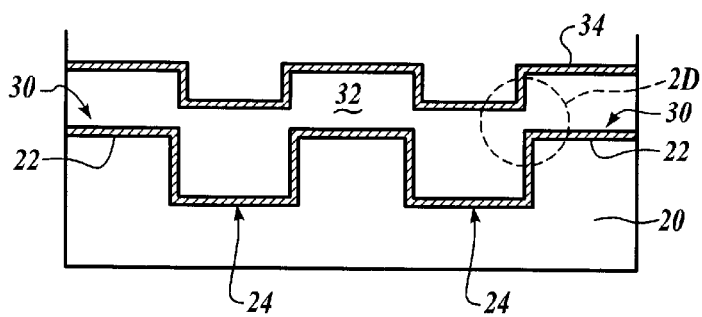
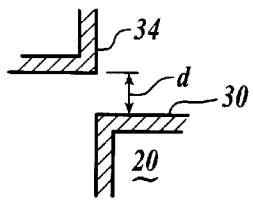
*Fig. 2A*  *Fig. 2D*
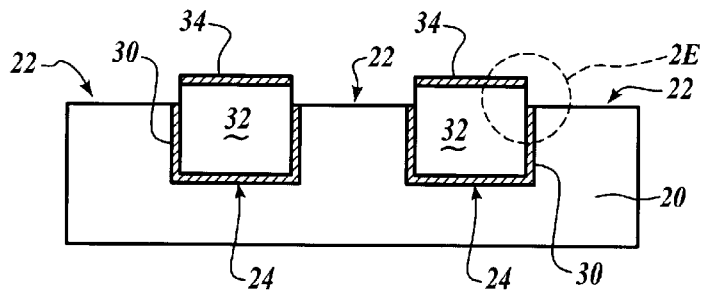
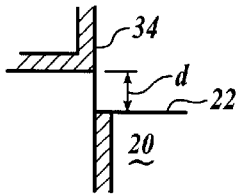
*Fig. 2B*  *Fig. 2E*
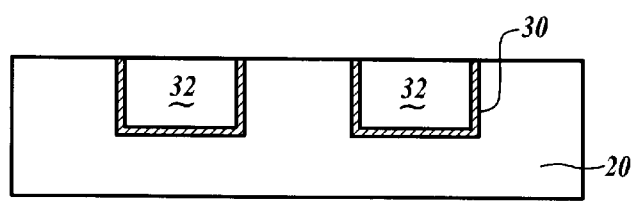
*Fig. 2C*
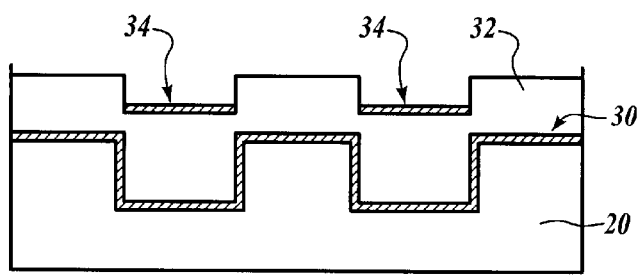
*Fig. 3*

US 6,258,711 B1

SACRIFICIAL DEPOSIT TO IMPROVE DAMASCENE PATTERN PLANARIZATION IN SEMICONDUCTOR WAFERS

FIELD OF INVENTION

This invention relates to the fabrication of semiconductors. More particularly, it relates to a process in which a sacrificial layer is added and used in conjunction with chemical-mechanical polishing to substantially reduce "dishing" and "erosion" of metallic or other inlaid patterns formed by damascene, dual damascene, or like processes.

BACKGROUND OF INVENTION

The fabrication of very large scale integrated circuits on silicon wafers is a process requiring extreme precision because of the very fine details of the circuits. Indeed, the width of circuit lines are continually decreasing, as the technology advances, and are now in the 0.18–100 micron range. Since these circuits are produced using photolithographic techniques, extremely accurately ground lenses are required to provide such fine detail. As a necessary consequence of providing such precise focusing, the lenses lack depth of field, i.e. an image is accurately produced only at a specific distance from the lens, and any deviation in this distance produces an increasingly unfocused or fuzzy image. Therefore, the surface onto which the image is projected must be as perfectly planar as possible to eliminate out of focus image fuzziness. A failure to maintain planarity exacerbates the problem as additional layers are formed on the nonplanar surface resulting in an increased proportion of defective semiconductors that must be rejected.

A standard technique for restoring surface planarity after inlaying metal in dual-damascene structures within a dielectric layer, is chemical-mechanical planarization (CMP). During this process, the surface of the wafer is polished, with a polishing pad and a chemical slurry, to remove excess metal and to replanarize it. The slurries contain an abrasive such as silica or alumina, and chemical additives that are designed to selectively react with and soften the composition of those components that must be planarized on the wafer surface. Accordingly, polishing slurries may be selected to enhance the removal rate of a particular component on the surface of the wafer, taking into account that certain of the components may be inherently more easily removed purely by abrasive action.

While aluminum has been the preferred conductive metal used in semiconductor circuitry in the past, the more recent trend is towards copper, which is a superior electrical conductor, using damascene and dual damascene (also known as "inlaid metallization") process techniques. This trend towards using damascene and dual-damascene inlaying of metal lines and vias has presented new challenges in semiconductor fabrication. It has been found that during CMP there are often unacceptable levels of "dishing" and "erosion" of copper surfaces. Indeed, depressions of about 1,000 Å or more may be formed. As pointed out above, as near perfect a planar surface is needed to enable modern fine line circuits. Dishing and erosion therefore present serious issues in the damascene and dual damascene metal inlay technology. The issues are illustrated schematically in FIGS. 1A, B and C. In FIG. 1A, a patterned substrate 2, for example an oxide layer, forms the underlying pattern structure to be filled with a fill composition, usually a metallic conductor, to form lines or vias. The patterned structure 2 includes a series of down features 4 and up features 6. The recesses 8 formed between the up and down features are filled with a fill material. As shown in FIG. 1A, a conformal intermediate layer (such as a "barrier", "liner" or "adhesive" layer) 12 is formed over the patterned layer or substrate 2. A conformal fill layer 14 is formed over the barrier layer 12.

In the prior art, chemical-mechanical polishing is applied to the structure shown in FIG. 1A, to produce the structure shown in FIG. 1B, wherein the major portion of the fill material 14 has been removed. The fill material is homogeneous and sufficiently thick that planarization is usually achieved before pattern clearing commences. Once pattern clearing commences, the dishing and erosion issues arise. Thus, upon further polishing for pattern clearing, removal of the thin layer of fill material 14 that extends above the up features 6 of the conformal layer, produces the structure shown in FIG. 1C. Because the CMP is designed to have the highest polish or removal rate for the fill material, and a lower rate on the intermediate layer (or substrate, in the absence of such a layer), the inlaid material continues to be removed at a higher rate. This results in "dishing" of the inlaid material 14, in that the upper surfaces of the material are not coplanar with the up features of patterned structure 2. Instead, the upper surfaces of fill material 14 in the recesses are "dished" below the surfaces of up feature 6. Moreover, pattern clearing uniformity across the wafer is not perfect, so that overpolish is necessary to clear the pattern on all semiconductors being fabricated in the wafer. Overpolish further aggravates the dishing problem that results from unmatched material selectivity, as explained above.

Dishing is often accompanied by erosion, a different but related topographical feature. Erosion arises when recesses of the fill material cause stress concentrations at fine matrix/substrate features which increase polish rates locally and result in pattern deterioration.

The lack of planarity that is caused by dishing and erosion is undesirable for several reasons, including the resultant undesirable large variations in pattern features (size and density), as well as for those reasons discussed above. Thus, dishing and erosion and should be reduced as far as possible, or eliminated if feasible.

SUMMARY OF THE INVENTION

The invention provides a method of reducing dishing and erosion of inlaid material surfaces thereby improving the planarity of the surface of a semiconductor wafer and reducing the reject rate of semiconductors caused by the dishing and erosion problem. The invention is particularly applicable to those semiconductor fabrication processes using the damascene or dual damascene processes.

In accordance with an embodiment of the invention, an optional conformal intermediate layer is formed over patterned surface structure on the semiconductor wafer. This surface structure typically includes "up" (raised) features and "down" (recessed) features. Lines and vias are formed in the recesses of the down features. In damascene-type processes, a conformal fill layer, usually metallic, is formed over the intermediate layer, or directly over the patterned substrate, if such layer is not present. This fill layer has a thickness sufficient such that its down features are vertically spaced from up features of the underlying intermediate layer. The degree of vertical spacing between the down features of the fill layer and the up features of the intermediate layer or patterned substrate constitute an amount of "overfill". A sacrificial conformal layer (or preferential deposition of a sacrificial composition on the down features) is formed over the fill layer. This sacrificial layer or fill is preferably designed to be removed in pattern clearing at about the same time or slightly before the intermediate layer, using chemical-mechanical polishing (CMP). This can be achieved in several ways, for example, it may be of about the same thickness (or slightly thicker) and of the same or similar material as the intermediate layer.

Upon initial polishing of the wafer surface, up features of the sacrificial layer are removed along with underlying fill (which is removed at a faster rate), until residual down features of the sacrificial layer are exposed to the polisher. The surface then includes these residual down features as "caps" on the fill in the patterned substrate. Upon further polishing for pattern clearing, the caps of the sacrificial layer are removed along with up features of the intermediate layer. This produces a surface wherein the upper surfaces of the patterned fills (or "inlaid material") have reduced dishing and erosion, as compared to the prior art. As a result, reduced reject rates of semiconductors caused by the dishing and erosion phenomena may be expected.

In another embodiment of the invention, the optional intermediate ("barrier" or "adhesion" or "liner") layer is not present and the reduced dishing and erosion benefits are achieved through polishing up features of the patterned substrate and down features of the sacrificial layer (or fill) during pattern clearing using CMP removing up features faster than the sacrificial layer caps, and inlaid fill faster than the up features, once the caps have been polished off.

The "sacrificial deposit" need not necessarily be a continuous conformal layer, but may in accordance with the invention be a "sacrificial bottom fill" in the down features of the fill layer. Thus, after initial CMP to remove the bulk of the fill layer, the sacrificial deposit, regardless of whether a layer or only a bottom fill, forms caps over the inlaid material which are removed in pattern clearing by CMP.

In accordance with one embodiment of the invention, the CMP can be carried out in a single step, using a single slurry with a predetermined ratio of removal rates for the intermediate and sacrificial layers relative to the fill layer. In other embodiments, multi-step polishing may be used, as desired for particular applications.

BRIEF DESCRIPTION OF THE DRAWINGS

The following drawings serve to illustrate embodiments of the invention and the invention is not limited to these, but certain of the drawings schematically present preferred embodiments of the invention, as disclosed herein.

FIGS. 1A, B, and C illustrate a prior art standard fill pattern utilized in the damascene process;

FIGS. 2A, B, and C, D and E are schematic cross-sectional views of a portion of a surface of a semiconductor wafer illustrating an embodiment of the method of the invention; and FIG. 3 is a schematic cross-sectional view of a portion of a surface of a semiconductor in accordance with an embodiment of the invention.

DETAILED DESCRIPTION OF THE PREFERRED EMBODIMENTS

The invention provides a method of fabricating semiconductors that reduces the rate of semiconductor product rejection because it reduces dishing and erosion of inlaid materials thereby facilitating the formation of electrically sound layered structures on the wafer surface to more reliably form semiconductors both at a location on the wafer surface and across a larger area of the wafer surface. The method therefor also offers the potential for producing larger numbers of semiconductors per wafer. The method is more particularly applicable to those fabrication processes that utilize damascene and dual damascene processes for inlaying circuit features, such as lines and vias, into "down features" in recesses of a patterned substrate surface.

In accordance with the invention, the pattern for inlaying of a fill composition is either a pattern formed on a layer (or film) or the silicon itself as the substrate. Thus, the term "patterned substrate" as used in the specification and claims includes, for example, the patterned surface of a silicon wafer, patterned silicon oxide, patterned metal (such as aluminum or another metal), patterned low-k, and the like.

The conformal optional intermediate layer is either a "barrier" layer, or an "adhesive" layer, or a "liner" layer and is a layer interposed between the patterned substrate and the fill. The particular type of layer may be selected as required for a particular application depending on the fill and the underlying substrate. In general a barrier layer functions to bar diffusion of atoms of the fill material. Typically, the composition of the barrier layer comprises the refractory metals, oxides, nitrides oxynitrides and suicides of a metal, such as but not limited to tantalum, tantalum nitride, titanium, titanium nitride, and the like. The intermediate layers may be of any composition compatible with the device and necessary to perform its barrier, liner, or adhesive function, but it should have a lower polish rate ("removal rate") in CMP than the fill.

The fill composition or material for filling the recesses in the pattern may be selected from a range of materials, but is typically a metal in the damascene-type processes where the inlaid metal forms conductive lines and/or vias. Thus, for example, the material may be selected from copper, silver, gold, aluminum, tungsten, and alloys of these. The fill material is not, however, restricted to conductive metallic materials, but depends upon the function the fill is to perform in the semiconductor, and therefore may also be composed of, for example, silicon oxide, silicon nitride, poly-Si, and the like.

The composition of the sacrificial layer or down fill may be of any material that is compatible with semiconductor device fabrication and that has a low rate of removal in chemical-mechanical polishing relative to up features of the patterned substrate. Preferably, but not necessarily, the sacrificial layer is of the same material as the barrier layer, when one is used.

Instead of requiring a planar topography at the onset of pattern clearing, the invention commences pattern clearing with a wafer topography that has slightly raised caps, of residual material of low removal rate (down features of the sacrificial layer or fill) over the inlaid fill, that may extend above the surrounding up features of the substrate. As will be apparent from the explanation below, the (bases of the) caps are elevated above the fill by the thickness of the overfill. Since the removal rate of the cap material is lower than for the surrounding up features of fill material, the caps are raised on the surface. Planarity is achieved on pattern clearing when the the caps are removed or after overpolishing.

In an embodiment of the invention illustrated schematically in FIGS. 2A, B, and C, a patterned substrate 20, has a topography that includes up features 22 and down features 24. (It should be understood that FIG. 2 is merely an illustrative example and that a variety of patterns of up and down features are possible, and necessary, in order to produce a desired semiconductor circuitry configuration.) As shown in FIG. 2A, in accordance with this embodiment of the invention, a conformal intermediate layer 30 is formed over the patterned substrate 20. A conformal layer of fill material 32 is formed over the intermediate layer 30. The fill layer 32 has an overfill of thickness d, that is preferably minimized to shape the polish topograhy as close to planar as possible before pattern clearing commences. A conformal sacrificial layer 34 is formed over the fill layer 32.

In accordance with the invention, the polish times for removal of sacrificial layer 34 and intermediate layer 30 are selected to be substantially matched (i.e. identical, as close to each other as possible, or substantially similar) and, preferably, the sacrificial layer has a marginally shorter removal time than the intermediate layer. This selection of removal times best achieves the objective of reducing dishing and erosion, as explained below. This matching can be achieved in a variety of ways. For example, the two layers may be of substantially the same thickness and composition so that identical removal times are expected. (The sacrificial layer is preferably slightly thicker to compensate for enhanced removal of up features relative to down features in CMP.) Alternatively, they may be of different composition and thicknesses, with the thicker layer of a composition having an estimated removal rate rr(thick)={d(thick)/d(thin)}×rr(thin); where d(thick) and d(thin) are respectively the thicknesses of the thicker and thinner of the two layers, and rr(thin) is the rate of removal of the thinner layer. Adjustment for the more preferred higher removal rate of up features may be made based on empirical data.

As pointed out above, in accordance with the invention, the thickness of the fill layer 32 is such as to provide a controlled amount of "overfill", as measured by an average vertical distance d between up features of the patterned substrate 20 and down features of the conformal fill layer 32. It is advantageous, but not essential to the invention, to reduce this vertical spacing d to a minimum in order to shape the topography prior to pattern clearing. Reduction of overfill d also reduces deposition and polish time, reduces wastage, and materials costs. The structure of FIG. 2A is subjected to chemical-mechanical polishing. Preferably, the removal rate of the fill layer 32 is greater than that of the sacrificial layer 30. Fill material may have a removal rate in the range from about 1,000 to about 10,000 Å. Thus, the excess fill material is ordinarily removed under CMP in less than about 5 minutes, and preferably in about 1 to about 2 minutes, or less. The sacrificial layer material usually has a rate of removal of about 100 Å or more, but less than the fill material. The up features of the sacrificial layer are preferably removed in less than about 5 minutes, and more preferably in about 1 to about 2.

After removal of the up features of sacrificial layer 34, and substantially all up features of the fill layer 32, a structure like that of FIG. 2B is produced, just before pattern clearing commences. This structure includes an upper surface that has up features of intermediate layer 30 on patterned layer 20 and the down features of sacrificial layer 34, which form "caps" laid down on overfill and that cover the fill material in the recesses 26 of patterned substrate 20 (i.e. the topography is not entirely planar).

For pattern clearing, CMP is carried out with the same or another slurry having a removal rate that is increased for the patterned layer and the structure shown in FIG. 2C is produced. In this structure, the upper surfaces of fill material in recesses 26 are substantially free of dishing and erosion and substantially coplanar with the residual up features of patterned layer 20. Thus a planar surface with a substantial reduction in dishing and erosion is achieved relative to the prior art.

In accordance with the invention, in CMP for pattern clearing, the sacrificial layer has a lower rate of removal than the up features of the patterned substrate, which in turn has a lower rate of removal than the fill material. Thus, an appropriate polishing slurry may be designed or selected to achieve the CMP in a single step. Otherwise, multi-step CMP may be used. For example, a first slurry may be used to polish until a point where the bulk of the fill has been removed, then a second slurry may be used to polish the residual intermediate and/or sacrificial layer features of the sacrificial layer. End point detection may be facilitated by the degree of overfill or detection of the caps, which could be used to automatically change to a second slurry in a two-step CMP process.

As indicated above, the sacrificial composition need not be laid down in a conformal layer, but should at least be deposited in the down features of the fill layer. For example, in the embodiment illustrated in FIG. 3, a sacrificial down fill 34 is formed in the down features of the conformal fill layer 32. It should be clear that upon chemical-mechanical polishing in accordance with the invention, CMP removal of material first results in structure like that illustrated schematically in FIG. 2B before pattern clearing. In other words, the sacrificial down fills 34 form caps 34 over a residual inlaid fill material 32 in the recesses or down features of the patterned substrate 20.

In accordance with the invention, a sacrificial composition is formed at least on down features of the fill layer, resulting in the formation of sacrificial caps over inlaid fill material. Upon pattern clearing, the CMP removes material from surrounding features at a higher rate than the material of the sacrificial caps. This prevents dishing that might occur if the caps were removed at a higher rate than the material of surrounding features. Once the caps are cleared, since the CMP slurry removes fill material at a higher rate than surrounding material, planarization is achieved by polishing the upper surfaces of the inlaid material to coplanarity with surrounding material. If overpolishing should occur it would result in substantially less dishing than would have been obtained without applying a sacrificial deposit or layer.

In accordance with the invention, the sacrificial deposit has a lower removal rate than the fill layer composition for the caps to be formed. The ratio of relative removal rate can vary widely, depending on several factors, but it is preferred that the fill layer have a removal rate from about 5 to about 1,000 times, and more preferably from about 10 to about 100 times greater than the sacrificial deposit removal rate. Moreover, the rate of removal of the fill layer (i.e. inlaid material) removal rate is also preferably higher than that of the patterned substrate. Preferably, but not necessarily, the fill material is removed at a rate from about 5 to about 100 times faster than the substrate.

The scope of the invention is not limited to the foregoing description of the preferred embodiments, which are illustrative of the invention, but the scope of the invention is as set forth in the properly construed claims herebelow, including any derivations and modifications that may become apparent to one of ordinary skill in the art and that do not substantially depart from the scope of said claims.

What is claimed is:

1. A method of reducing dishing and erosion in inlays of a surface of a semiconductor wafer during semiconductor integrated circuit fabrication, the method comprising:

(i) selecting a semiconductor wafer having a surface comprising a patterned substrate, the patterned substrate overlaid with a conformal fill layer, the fill layer comprising fill inlaid in down features of the patterned substrate, the fill layer also comprising an amount of overfill, and the fill layer coated, at least on its down features with a sacrificial composition;

(ii) subjecting the surface of the wafer to chemical-mechanical polishing to remove excess fill material to produce caps of sacrificial composition on the wafer surface over inlaid fill; and (iii) polishing for pattern clearing with a slurry providing a rate of removal greater for up features surrounding the caps than for the caps during the polishing.

2. The method of claim 1, wherein the fill layer comprises a conformal metallic composition.

3. The method of claim 1, wherein the conformal fill layer comprises a composition selected from the group consisting of copper, silver, gold, aluminum, tungsten, and alloys of these.

4. The method of claim 1, wherein the subjecting to polishing and the polishing comprise a one-step polishing process utilizing a single slurry.

5. The method of claim 4, wherein the single slurry has a removal rate of from about 5 to about 1,000 times greater for the fill layer than the sacrificial composition.

6. The method of claim 1, wherein the polishing comprises polishing with a slurry having a removal rate of from about 10 to about 100 times greater for the fill layer than the sacrificial composition.

7. The method of claim 1, wherein the polishing comprises polishing with a slurry having a removal rate of from about 5 to about 100 times greater for the fill layer than the substrate.

8. The method of claim 1, wherein the sacrificial composition is a conformal layer coating the fill layer.

9. The method of claim 1 wherein the selecting comprises selecting a wafer having an intermediate layer interposed between the patterned substrate and the fill layer.

10. The method of claim 9, wherein the polishing for pattern clearing comprises removing the intermediate layer before the caps.

11. The method of claim 9, wherein the polishing for pattern clearing removes the caps at substantially the same time as the intermediate layer.

12. The method of claim 9, wherein the sacrificial composition and the intermediate layer are the same material.

13. The method of claim 12, wherein the sacrificial composition comprises a deposit thicker than the intermediate layer.

14. A method of reducing dishing and erosion in metallic inlays of a surface of a semiconductor wafer during semiconductor integrated circuit fabrication, the method comprising:

(i) selecting a wafer comprising a patterned surface structure on the surface thereof;

(ii) forming a conformal metallic fill layer over the patterned surface, the metallic layer filling down features of the patterned surface and having an amount of overfill;

(iii) forming a sacrificial deposit over at least the down features of the metallic fill layer, the sacrificial deposit selected to have a chemical-mechanical polish removal rate less than the rate of removal of the metallic fill when using a slurry; and (iv) polishing the wafer surface with the slurry to form caps of sacrificial deposit over metallic fill in the patterned surface, and then continuing polishing for pattern clearing.

15. The method of claim 14, wherein the forming of a conformal metallic fill layer comprises forming a layer comprised of a metal selected from the group consisting of copper, silver, gold, aluminum, tungsten, and alloys thereof.

16. The method of claim 14, further comprising the forming of a conformal intermediate layer between the patterned surface and the metallic layer.

17. The method of claim 14, wherein the forming of a sacrificial deposit comprises forming a conformal sacrificial layer.

18. The method of claim 14, wherein the polishing comprises polishing in a single process step process.

19. The method of claim 14, wherein the polishing comprises polishing with a slurry having a removal rate of from about 5 to about 1,000 times greater for the metallic fill than for the sacrificial deposit.

20. The method of claim 16, wherein wherein the sacrificial deposit and the intermediate layer are the same material.

21. The method of claim 20, wherein the sacrificial deposit is thicker than the intermediate layer.

22. A method of planarizing a surface in a damascene process, the method comprising:

(i) forming a layer of sacrificial material on a layer of fill material, the fill material having inlaid portions filling down features in a substrate;

(ii) polishing the layers of sacrificial and fill materials using a chemical-mechanical polishing process to remove excess fill material and to produce caps of sacrificial material over the inlaid portions of fill material; and (iii) continuing the polishing to remove the sacrificial material and to clear fill material from portions of the substrate surface surrounding the inlaid portions of fill material.

23. The method of claim 22, wherein the polishing and continuing steps are performed in a single chemical-mechanical polishing process step.

24. The method of claim 23 wherein the single chemical-mechanical polishing process step uses a single slurry.

* * * * *